(12) United States Patent
Karda et al.

(10) Patent No.: US 9,076,686 B1
(45) Date of Patent: Jul. 7, 2015

(54) FIELD EFFECT TRANSISTOR CONSTRUCTIONS AND MEMORY ARRAYS

(71) Applicant: Micron Technology, Inc., Boise, ID (US)

(72) Inventors: Kamal M. Karda, Boise, ID (US); Chandra Mouli, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/152,664

(22) Filed: Jan. 10, 2014

(51) Int. Cl.
| H01L 21/336 | (2006.01) |
| H01L 27/115 | (2006.01) |
| H01L 29/66 | (2006.01) |
| H01L 29/06 | (2006.01) |
| H01L 29/24 | (2006.01) |
| H01L 21/02 | (2006.01) |

(52) U.S. Cl.
CPC .... *H01L 27/11582* (2013.01); *H01L 29/66666* (2013.01); *H01L 29/66484* (2013.01); *H01L 29/0603* (2013.01); *H01L 27/11556* (2013.01); *H01L 29/24* (2013.01); *H01L 21/02568* (2013.01)

(58) Field of Classification Search
None
See application file for complete search history.

(56) References Cited

U.S. PATENT DOCUMENTS

| 6,370,056 | B1 | 4/2002 | Chen et al. |
| 6,717,215 | B2 | 4/2004 | Fricke et al. |
| 7,525,830 | B2 | 4/2009 | Kang |
| 8,304,823 | B2 | 11/2012 | Boescke |
| 2011/0248324 | A1 | 10/2011 | Kang |
| 2012/0248398 | A1 | 10/2012 | Liu |
| 2012/0280291 | A1* | 11/2012 | Lee et al. ............ 257/288 |
| 2012/0319185 | A1* | 12/2012 | Liang et al. ......... 257/314 |
| 2013/0043455 | A1 | 2/2013 | Bateman |
| 2013/0056698 | A1 | 3/2013 | Satoh et al. |

FOREIGN PATENT DOCUMENTS

| WO | WO 2008-073529 | 6/2008 |
| WO | PCT/US2014/047570 | 11/2014 |

OTHER PUBLICATIONS

U.S. Appl. No. 13/964,309, filed Aug. 12, 2013, Karda et al.
Breakdown of High-Performance Monolayer MoS2 Transistors; Lembke et al.; www.acsnano.org; Oct. 2010; pp. A-F.
Das et al.; High Performance Multliayer MoS2 Transistors with Scandium Contacts; NANO Letters; ACS Publications; Dec. 14, 2012; pp. 100-105.

(Continued)

*Primary Examiner* — Kyoung Lee
(74) *Attorney, Agent, or Firm* — Wells St. John, P.S.

(57) ABSTRACT

A field effect transistor construction comprises two source/drain regions and a channel region there-between. The channel region comprises a transition metal dichalcogenide material having a thickness of 1 monolayer to 7 monolayers and having a physical length between the source/drain regions. A mid-gate is operatively proximate a mid-portion of the channel region relative to the physical length. A pair of gates is operatively proximate different respective portions of the channel region from the portion of the channel region that the mid-gate is proximate. The pair of gates are spaced and electrically isolated from the mid-gate on opposite sides of the mid-gate. Gate dielectric is between a) the channel region, and b) the mid-gate and the pair of gates. Additional embodiments are disclosed.

38 Claims, 6 Drawing Sheets

(56) References Cited

OTHER PUBLICATIONS

Ferroelectric Nonvolatile Nanowire Memory Circuit Using a Single ZnO Nanowire and Copolymer Top Layer; Tack Lee et al.; Advanced Materials 2012, 24, pp. 3020-3025.
Ferroelectric RAM; hhtp://en.wikipedia.org/wiki/Ferroelectric_RAM; Last Modified Feb. 25, 2013; 6 pp.
Large Area Vapor Phase Growth and Characterization of MoS2 Atomic Layers on SiO2 Substrate; Zhan et al.; Dept. of Mechanical Engineering & Materials Science; Rice University: Feb. 15, 2012; 24 pp.
Liu et al.; Growth of Large-Area and Highly Crystalline MoS2 Thin Layers on Insulating Substrates; NANO Letters; ACS Publications; Feb. 27, 2012; pp. 1538-1544.
Min et al.; Nanosheet thickness-modulated MoS2 dielectric property evidenced by field-effect transistor performance; The Royal Society of Chemistry; Dec. 3, 2012; 2 pp.
MoS 2 Nanosheets for Top-Gate Nonvolatile Memory Transistor Channel; Sung Lee et al.; Small 2012,8, No. 20, pp. 3111-3115.
R.S. Lous; Ferroelectric Memory Devices, How to store information of the future; Top Master Programme in Nanoscience; Jul. 2011; 23 pp.
Single-layer MoS2 transistors; Radisavijevic et al.; Nature Nanotechnology; vol. 6; Mar. 2011; pp. 147-150.
W. Liu et al.; Role of Metal Contacts in Designing High-Performance Monolayer n-Type WSe2 Field Effect Transistors; NANO Letters; ACS Publications; Mar. 25, 2013; pp. 1983-1990.
Zhang et al.; Ambipolar MoS2 thin Flake Transistors; NANO Letters; ACS Publications; Jan. 25, 2012; pp. 1136-1140.
U.S. Appl. No. 14/260,977, filed Apr. 24, 2014, Ramaswamy.
Current Status of Ferroelectric Random-Acess Memory; Arimoto et al.; MRS Bulletin; Nov. 2004; pp. 823-828.
Nonvolatile ferroelectric-gate field-effect transistors using SrBi2Ta2O9/Pt/SRTa2O6/SiON/Si structures; E. Tokumitsu; Applied Physics Letters, vol. 75, No. 4; Jul. 26, 1999; pp. 575-577.
Recent Progress of Ferroelectric-Gate Field-Effect Transistors and Applications to Nonvolatile Logic and FeNAND Flash Memory; Sakai et al.; Materials 2010, 3, Nov. 18, 2010; pp. 4950-4964.
U.S. Appl. No. 14/152,664, filed Jan. 10, 2014, Karda et al.
U.S. Appl. No. 14/305,459, filed Jun. 16, 2014, Ramaswamy et al.
U.S. Appl. No. 14/508,912, filed Oct. 7, 2014, Ramaswamy.

\* cited by examiner

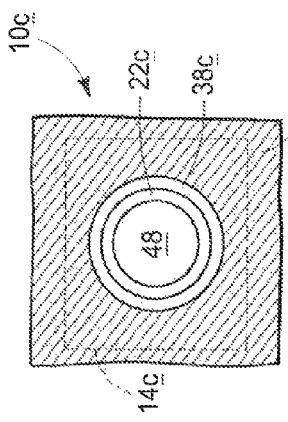
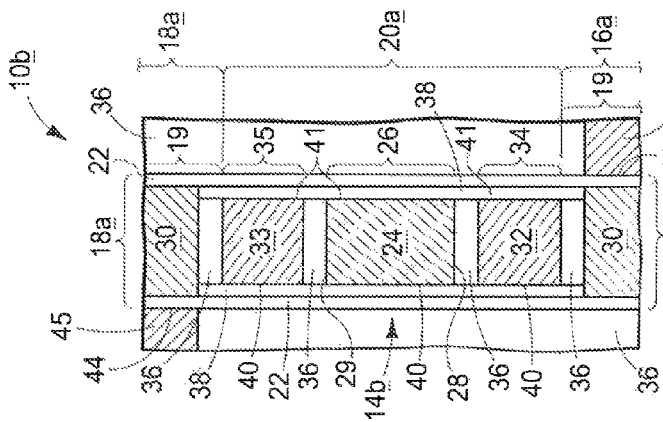
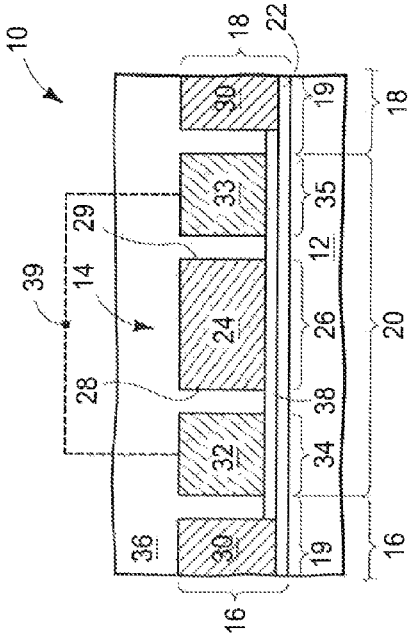
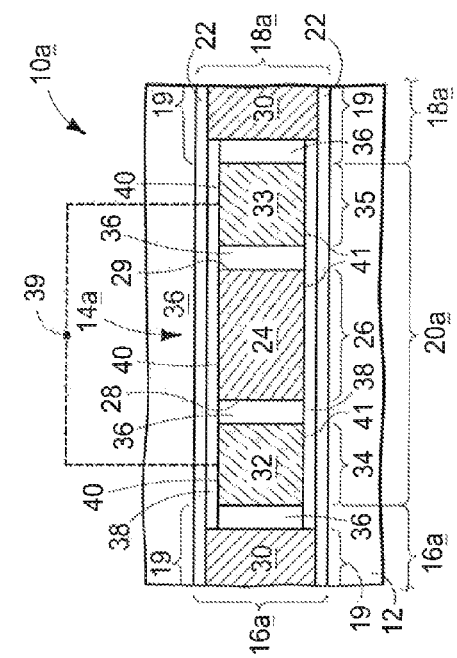
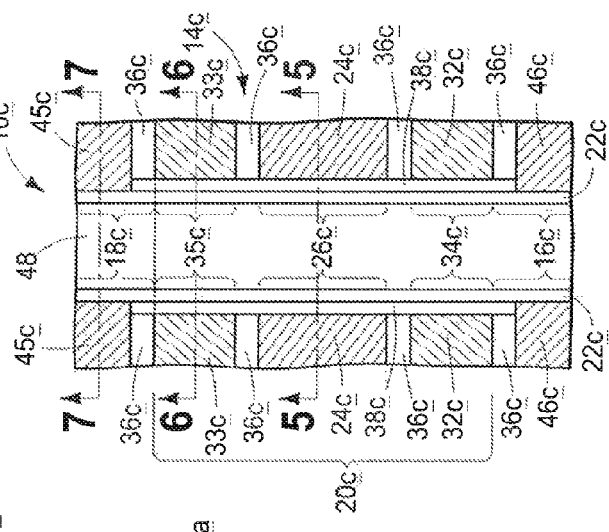

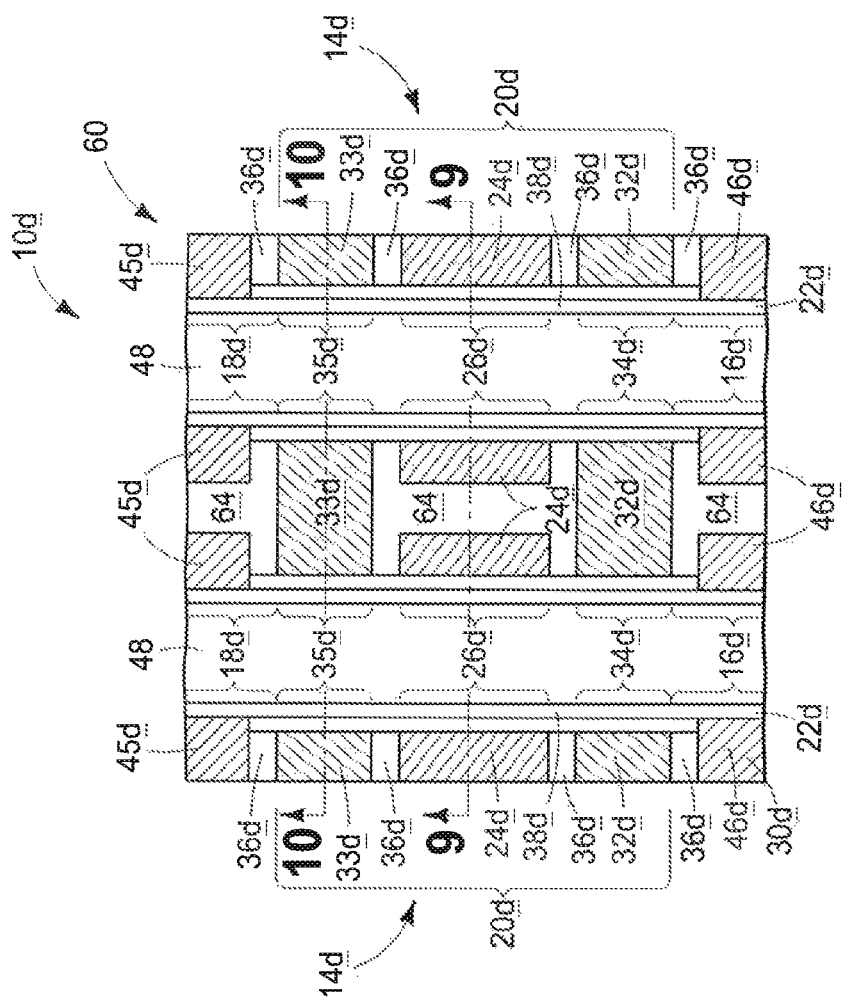
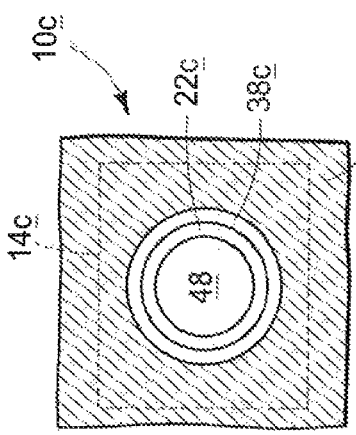
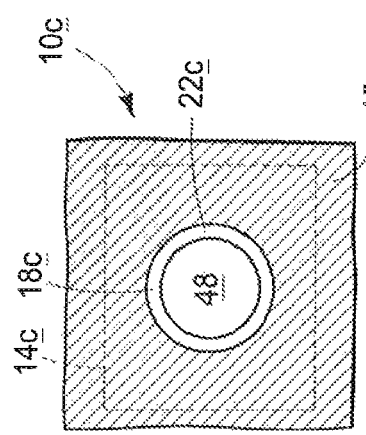

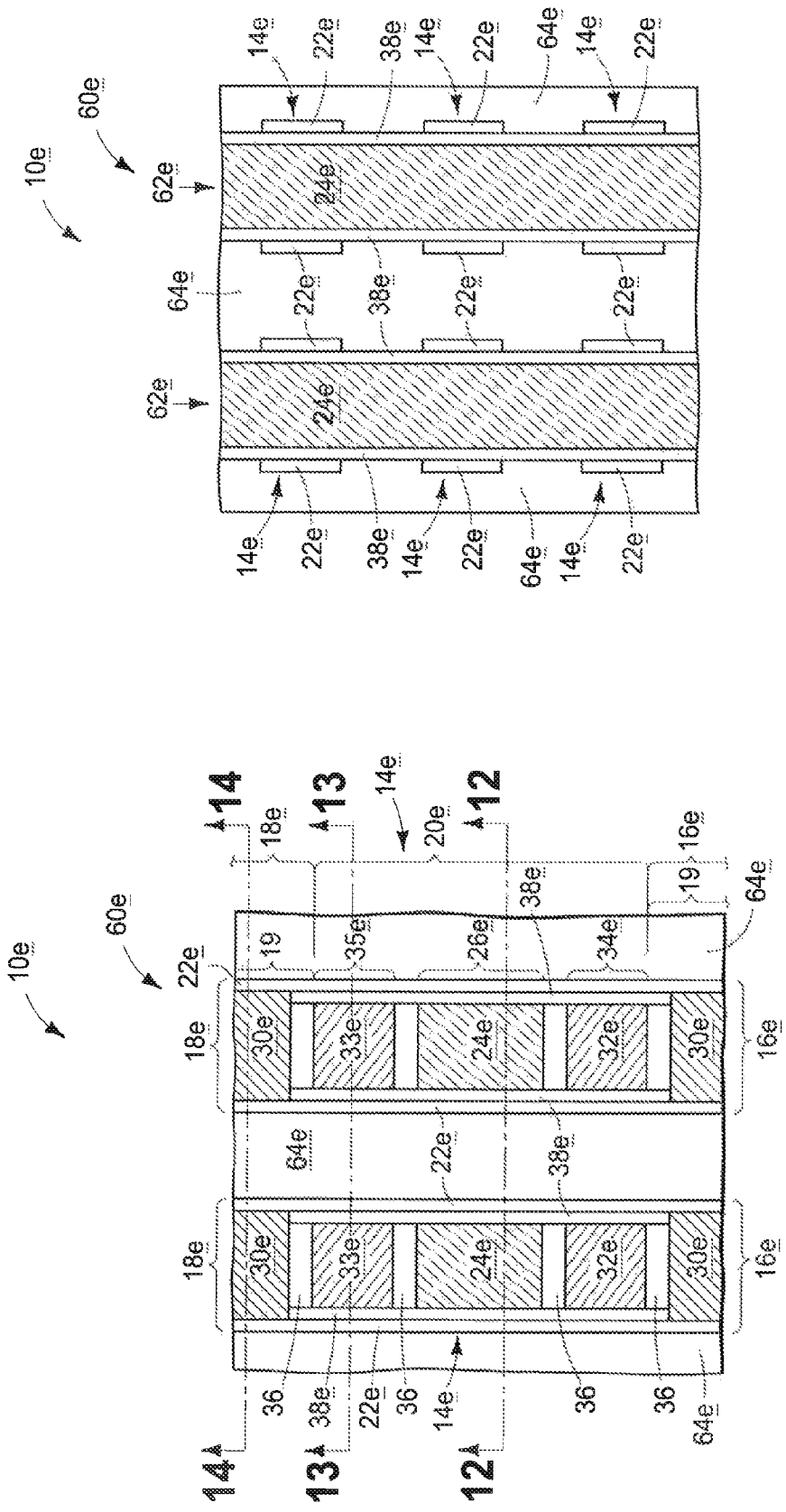

FIELD EFFECT TRANSISTOR CONSTRUCTIONS AND MEMORY ARRAYS

TECHNICAL FIELD

Embodiments disclosed herein pertain to field effect transistor constructions and to memory arrays having a plurality of field effect transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate dielectric. Application of a suitable voltage to the gate allows current to flow from one of the source/drain regions to the other through the channel region. When the voltage is removed from the gate, current is largely prevented from flowing through the channel region. Field-effect transistors may also include additional structure, for example reversibly programmable charge storage regions as part of the gate construction. Ideally, length of the channel region is made as short as possible to maximize operating speed of the transistor in the "on" state and to maximize circuit density. However, short physical channel length is not good in the "off" state as leakage current ($I_{off}$) between the source/drain regions is higher for short channel devices than for long channel devices.

BRIEF DESCRIPTION OF THE DRAWINGS

FIG. 1 is a diagrammatic sectional view of a substrate fragment comprising a field effect transistor in accordance with an embodiment of the invention.

FIG. 2 is a diagrammatic sectional view of a substrate fragment comprising a field effect transistor in accordance with an embodiment of the invention.

FIG. 3 is a diagrammatic sectional view of a substrate fragment comprising a field effect transistor in accordance with an embodiment of the invention.

FIG. 4 is a diagrammatic sectional view of a substrate fragment comprising a field effect transistor in accordance with an embodiment of the invention.

FIG. 5 is a sectional view taken through line 5-5 in FIG. 4.
FIG. 6 is a sectional view taken through line 6-6 in FIG. 4.
FIG. 7 is a sectional view taken through line 7-7 in FIG. 4.

FIG. 8 is a diagrammatic sectional view of a substrate fragment comprising a portion of memory array in accordance with an embodiment of the invention.

FIG. 11 is a diagrammatic sectional view of a substrate fragment comprising a portion of memory array in accordance with an embodiment of the invention.

FIG. 12 is a sectional view taken through line 12-12 in FIG. 11.

DETAILED DESCRIPTION OF EXAMPLE EMBODIMENTS

Figure 10:
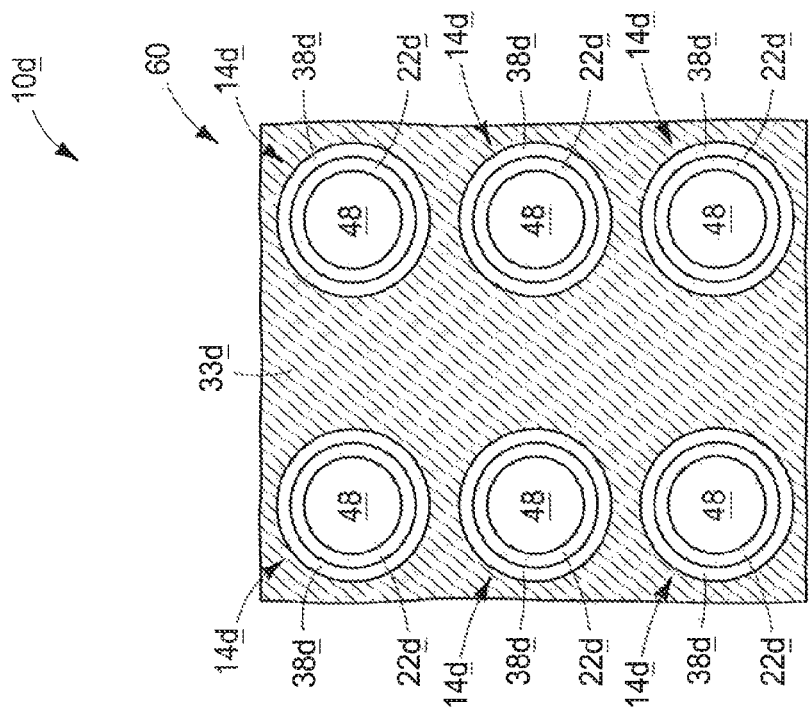
FIG. 10 is a sectional view taken through line 10-10 in FIG. 8.

An example field effect transistor construction in accordance with an embodiment of the invention is described initially with reference to FIG. 1. An example substrate fragment 10 comprises dielectric material 12 having various materials formed there-over which comprise a field effect transistor construction 14. Example dielectric materials 12 are doped silicon dioxide, undoped silicon dioxide, and silicon nitride. Other partially or wholly fabricated components of integrated circuitry may be formed as part of, or be elevationally inward of, material 12. Substrate fragment 10 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Transistor construction 14 comprises two source/drain regions 16, 18 and a channel region 20 there-between. Channel region 20 comprises a transition metal dichalcogenide material 22 having a thickness of 1 monolayer to 7 monolayers and has a physical length between source/drain regions 16 and 18 (e.g., the length shown as the bracketed expanse 20). In this document, "thickness" is defined as the mean straight-line distance through a given material perpendicularly from a closest surface of immediately adjacent material of different composition. In one embodiment, transition metal dichalcogenide material 22 is no greater than 4 monolayers in thickness, and in one embodiment is no greater than 2 monolayers in thickness. Example materials include one or more of $MoS_2$, $WS_2$, $InS_2$, $MoSe_2$, $WSe_2$, and $InSe_2$.

In one embodiment and as shown, source/drain regions 16 and 18 also comprise transition metal dichalcogenide material 22 having a thickness of 1 monolayer to 7 monolayers (e.g., an extension portion 19 of material 22). Source/drain regions 16 and 18 are shown as comprising conductive (i.e., electrically) material 30 that is directly against dichalcogenide material 22. Conductive material 30 may be any one or more of conductively-doped semiconductive material, one or multiple elemental metal(s), an alloy of elemental metals, and a conductive metal compound. Conductive material 30 may alternately extend to dielectric material 12 in the absence of transition metal dichalcogenide material 22 being between materials 12 and 30. Further when dichalcogenide material 22 is between materials 12 and 30, the respective source/drain regions may be considered as constituting material 22 that is directly against material 30, with material 30 being considered as a conductive contact to material 22 as opposed to necessarily per se being considered as part of two source/drain regions of transistor construction 14.

In one embodiment, channel region 20 is devoid of conductivity enhancing impurity and in one embodiment is devoid of detectable conductivity enhancing impurity. In this document, "devoid of conductivity enhancing impurity" means no more than $1 \times 10^{14}$ atoms/cm$^3$. In one embodiment, source/drain regions 16 and 18 are devoid of conductivity enhancing impurity and in one embodiment are devoid of detectable conductivity enhancing impurity. In one embodiment where transition metal dichalcogenide material 22 comprises at least part of the respective source/drain regions, such material 22 is devoid of conductivity enhancing impurity and in one embodiment is devoid of detectable conductivity enhancing impurity.

Transistor construction 14 comprises a mid-gate 24 operatively proximate a mid-portion 26 of channel region 20 relative to the physical length thereof. In one embodiment and as shown, mid-portion 26 is centered relative to channel region 20. Mid-gate 24 may be considered as having opposite sides 28 and 29. A pair of gates 32 and 33 is operatively proximate different portions 34 and 35, respectively, of channel region 20, with portions 34 and 35 each being different from portion 26. Gate 32 is spaced and electrically isolated from mid-gate 24 on side 28, and gate 33 is spaced and electrically isolated from mid-gate 24 on side 29 in the depicted example. Such electrical isolation is shown occurring by dielectric material 36 that is laterally between immediately adjacent of conductive components 30, 32, 24, 33, and 30. Example dielectric materials 36 are the same as for material 12. An example lateral thickness for dielectric material 36 between the conductive material of structures 30, 32, 24, and 33 is from about 1 nanometer to 15 nanometers. Additionally, gate dielectric 38 is between channel region 20 and each of mid-gate 24, gate 32, and gate 33. An example thickness for gate dielectric 38 is from about 1 nanometer to 30 nanometers.

In one embodiment, gates 32 and 33 are electrically coupled together, for example as is shown schematically via an interconnect line 39. In one embodiment, mid-gate 24 has a work function that is different from that of at least one of gates 32 and 33. Gates 32 and 33 may have the same work function relative one another or may have different work functions relative one another. In the context of this document, same work function means a difference in the work functions of zero to no more than 0.1 eV, and different work function means a difference in the work functions of at least 0.2 eV. In one embodiment, mid-gate 24, gate 32, and gate 33 have the same work function. In one embodiment, gates 32 and 33 are of the same composition. In one embodiment, mid-gate 24, gate 32, and gate 33 are all of the same composition. In one embodiment, mid-gate 24, gate 32, and gate 33 comprise conductively-doped semiconductive material that is n-type. In one such embodiment, work function of mid-gate 24 is greater than that of gates 32 and 33 (i.e., by at least 0.2 eV). In one embodiment, mid-gate 24 and gates 32 and 33 comprise conductively-doped semiconductive material that is p-type. In one such embodiment, work function of mid-gate 24 is less than that of gates 32 and 33 (i.e., by at least 0.2 eV). As some examples for materials of gates 24, 32, and 33, n+ doped polysilicon and p+ doped polysilicon (i.e., each doped to at least $1 \times 10^{20}$ atoms/cm$^3$) have work functions of about 4.0 eV and 5.1 eV, respectively. TiN has a work function of about 4.65 eV, with W and WN having work functions ranging between about 4.3 eV and 4.6 eV.

FIG. 2 shows a field effect transistor construction 14a formed with respect to a substrate fragment 10a in accordance with an alternate embodiment of the invention. Like numerals from the above-described embodiments have been used where appropriate, with some construction differences being indicated with the suffix "a". Gates 32, 24, and 33 may be considered as respectively comprising opposing sides 40 and 41, with those sides of mid-gate 24 being different from opposite mid-gate sides 28 and 29. Channel region 20a comprises transition metal dichalcogenide material 22 having a thickness of 1 monolayer to 7 monolayers on each of opposing sides 40 and 41 of mid-gate 24 and pair of gates 32, 33. Gate dielectric 38 is between transition metal dichalcogenide material 22 and each of opposing sides 40, 41 of mid-gate 24 and pair of gates 32, 33. In one embodiment and as shown, source/drain regions 16a and 18a individually comprise two spaced portions 19 of transition metal dichalcogenide material 22. Conductive material 30 is between and electrically couples portions 19 within both source/drain regions 16a, 18a. Again, material 30 may be considered as part of source/drain regions 16a, 18a perhaps dependent upon its composition, or as a conductive interconnect between source/drain regions that are considered as portions 19 of dichalcogenide material 22. As an alternate construction and analogous to that described above with respect to FIG. 1, no transition metal dichalcogenide material 22 may be between material 30 and material 12 (not shown), and between material 30 and material 36 (not shown).

Field effect transistor constructions in accordance with embodiments of the invention may have any desired orientation. FIGS. 1 and 2 show constructions 14 and 14a as being horizontally oriented. In alternate embodiments, a field effect transistor construction may be vertically oriented or oriented other than vertical or horizontal. In this document, vertical is a direction generally orthogonal to horizontal, with horizontal referring to a general direction along a primary surface relative to which a substrate is processed during fabrication. Further, vertical and horizontal as used herein are generally perpendicular directions relative one another independent of orientation of the substrate in three-dimensional space. Additionally, elevational, above, and below are with reference to the vertical direction. Further in the context of this document, a vertically oriented transistor is characterized by predominant current flow through the channel region in the vertical direction. Further in the context of this document, a horizontally oriented transistor is characterized by predominant current flow through the channel region in the horizontal direction.

As an example, a vertically oriented field effect transistor construction 14b is shown with respect to a substrate 10b in FIG. 3. Like numerals from the above-described embodiments have been used where appropriate, with some construction differences being indicated with the suffix "b" or with different numerals. The construction of FIG. 3 is analogous to that of FIG. 2, although a structure analogous to FIG. 1 or other structures may be used. FIG. 3 shows a vertically oriented field effect transistor construction 14b wherein gate 33 comprises an outer gate material that is spaced above and electrically isolated from material of mid-gate 24. Gate 32 comprises inner gate material that is spaced below and electrically isolated from material of mid-gate 24. Source/drain region 18a may be considered as an elevationally outer source/drain region and source/drain region 16a may be considered as an elevationally inner source/drain region. Outer source/drain region 18a and inner source/drain region 16a may be considered as comprising a respective lateral outer sidewall 44. In one embodiment, a conductive contact 45 is directly against lateral outer sidewall 44 of transition metal dichalcogenide material 22 of outer source/drain region 18a. In one embodiment, a conductive contact 46 is directly against lateral outer sidewall 44 of transition metal dichalcogenide material 22 of inner source/drain region 16a. Conductive contacts 45 and 46 are respectively shown as only contacting one lateral outer sidewall of transition metal dichalcogenide material 22 of each source/drain region. Alternately or additionally, conductive contacts may be directly against (not shown) an other lateral outer sidewall of transition metal dichalcogenide material 22 with respect to one or both source/drain regions.

An alternate embodiment vertical field effect transistor construction 14c is next described with reference to FIGS. 4-7 which show a substrate 10c. Like numerals from the above-described embodiments have been used where appropriate, with some construction differences being indicated with the suffix "c" or with different numerals. Vertical transistor construction 14c comprises an isolating core 48 (i.e., electrically isolating). Material of isolating core 48 may be dielectric, including for example any of the materials described above with respect to the composition of materials 12 and 36. The material of isolating core 48 may be semiconductive or conductive, and for example may provide an electrically isolating function for circuitry components (not shown) above and/or below vertical transistor construction 14c, for example being held at ground or some other potential.

Transition metal dichalcogenide material 22c encircles isolating core 48 and has a lateral wall thickness of 1 monolayer to 7 monolayers. A gate dielectric 38c encircles transition metal dichalcogenide material 22c. In one embodiment, isolating core 48, transition metal dichalcogenide material 22c, and gate dielectric 38c each have a respective perimeter that is circular in horizontal cross-section.

Conductive mid-gate 24c encircles gate dielectric 38c at an elevational mid-portion of transition metal dichalcogenide material 22c. Conductive outer gate material 33c encircles gate dielectric 38c at an elevational outer portion 35c of transition metal dichalcogenide material 22c. Outer gate material 33c is elevationally spaced and electrically isolated from mid-gate material 24c, for example by dielectric 36c. Conductive inner gate material 32c encircles gate dielectric 38c at an elevational inner portion 34c of transition metal dichalcogenide material 22c. Inner gate material 32c is elevationally spaced and electrically isolated from mid-gate material 24c, for example by dielectric 36c. A cross-section view is not shown with respect to inner gate material 32c for brevity. Such cross-section would appear identical to the FIG. 6 cross-section, but with numeral 32c instead being substituted for numeral 33c.

An elevationally outer source/drain region 18c encircles isolating core 48 and is spaced elevationally outward of and electrically isolated from outer gate material 33c. An elevationally inner source/drain region 16c encircles isolating core 48 and is spaced elevationally inward of and electrically isolated from inner gate material 32c. In one embodiment and as shown, the outer and inner source/drain regions 18c and 16c, respectively, comprise transition metal dichalcogenide material 22c having a lateral wall thickness of thickness of 1 monolayer to 7 monolayers. In one embodiment, a conductive contact is directly against a lateral outer sidewall of at least one of outer source/drain region 18c and inner source/drain region 16c, with example conductive contacts 45c and 46c being shown. A cross-section view is not shown with respect to inner source/drain region 16c for brevity. Such cross-section would appear identical to the FIG. 7 cross-section, but instead with numerals 16c and 46c being substituted for numerals 18c and 45c, respectively. Any other or additional attribute described above with respect to the FIGS. 1-3 embodiments may be applied with respect to the embodiments described with reference to FIGS. 4-7.

Transistors as described above may be used as part of any existing or yet-to-be-developed integrated circuitry. Further, and as an example, a plurality of the above-described field effect transistors may be incorporated within an array, such as a memory array. With respect to description of structure herein as respects an array, a sub-array (i.e., a portion of a total array) may also be considered as an array. In one embodiment, a memory array in accordance with the invention comprises a plurality of memory cells which individually comprise a vertical field effect transistor. The individual transistors comprise an elevationally outer source/drain region, an elevationally inner source/drain region, and a channel region elevationally between the outer and inner source/drain regions. The channel region comprises a transition metal dichalcogenide material having a lateral thickness of 1 monolayer to 7 monolayers and has a physical length elevationally between the source/drain regions. In one embodiment, the elevationally outer and inner source/drain regions comprise a transition metal dichalcogenide material having a lateral wall thickness of 1 monolayer to 7 monolayers. Regardless, a mid-gate is laterally proximate an elevationally mid-portion of the channel region. An outer gate is above the mid-gate laterally proximate an elevational outer portion of the channel region. The outer gate is elevationally spaced and electrically isolated from the mid-gate. An inner gate is below the mid-gate laterally proximate an elevational inner portion of the channel region. The inner gate is elevationally spaced and electrically isolated from the mid-gate. Gate dielectric is laterally between a) the channel region, and b) the mid-gate, the outer gate, and the inner gate. Ideally, the transistor construction is the same throughout the memory array, but not necessarily so. By way of examples only, transistor construction 14b of FIG. 3 and transistor construction 14c of FIGS. 4-7 are but two example vertical field effect transistor constructions usable in a memory and/or transistor array in accordance with the invention.

Regardless, at least one of a) the outer gates are electrically coupled to one another within the array, and b) the inner gates are electrically coupled to one another within the array. In one embodiment, the outer gates are electrically coupled to one another within the array and the inner gate are electrically coupled to one another within the array. In one embodiment, all of the inner gates are electrically coupled with all of the outer gates within the array. Other or additional attributes as described above with respect to the FIGS. 1-7 embodiments may be used.

Figure 9:
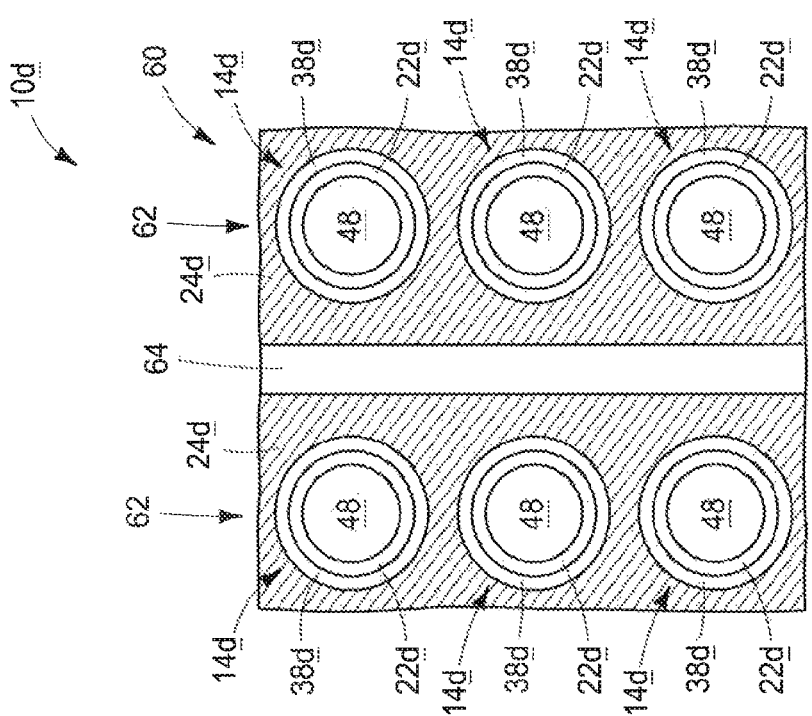
FIG. 9 is a sectional view taken through line 9-9 in FIG. 8.
Figure 14:
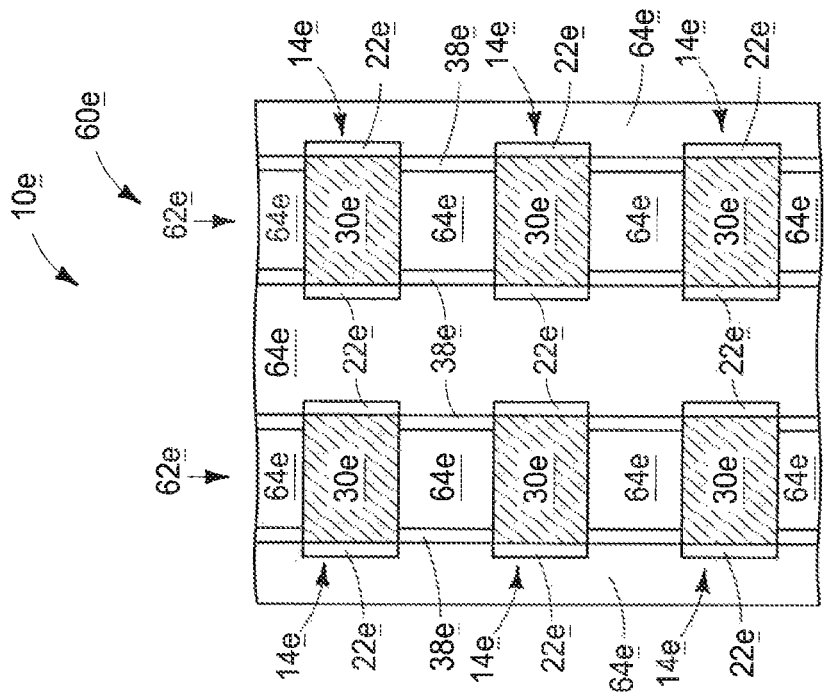
FIG. 14 is a sectional view taken through line 14-14 in FIG. 11.

A portion of one such example memory array 60 in accordance with an embodiment of the invention is shown with respect to a substrate 10d in FIGS. 8-10, and comprises a plurality of field effect transistor constructions like that of FIGS. 4-7. Like numerals from the above-described embodiments have been used where appropriate, with some construction differences being indicated with the suffix "d" or with different numerals. Example array 60 has mid-gates 24d interconnected (i.e., electrically coupled) among a plurality of transistors 14d in rows or columns 62 that are separated from one another by suitable dielectric material 64. At least one of a) outer gates 33d are electrically coupled to one another within the array, and b) inner gates 32d are electrically coupled to one another within the array. Outer gates 33d are shown as being electrically coupled throughout array 60, for example being plate-like. Inner gates 32d are shown as being electrically coupled throughout array 60, for example being plate-like. Gates 33d and 32d may be electrically coupled to one another. Dielectric materials 36d and 64 are shown isolating various components. Other or additional attributes as described above with respect to the FIGS. 1-7 embodiments may be used. Mid-gates 24 may be interconnected within the array in rows or columns to function as access lines. Bit lines (not shown) may interconnect one of the plurality of outer source/drains 18d or the plurality of inner source/drains 18e in the other of rows or columns to function as data/sense lines. Charge storage devices (not shown) (e.g., capacitors) may be electrically coupled to the other of the plurality of outer source/drains 18d or the plurality of inner source/drains 18e.

An alternate embodiment memory array 60e is shown with respect to a substrate 10e in FIGS. 11-14, and comprises a plurality of field effect transistor constructions like that of FIG. 3. Like numerals from the above-described embodiments have been used where appropriate, with some construction differences being indicated with the suffix "e" or with different numerals. Example array 60e has mid-gates 24e interconnected among a plurality of transistors 14e in rows or columns 62e that are separated from one another by dielectric material 64e. At least one of a) outer gates 33e are electrically coupled to one another within the array, and b) inner gates 32e are electrically coupled to one another within the array. Outer gates 33e are diagrammatically and schematically shown as being electrically coupled relative one another via an interconnect line 39 (FIG. 13), and all such outer gates 33e may be electrically coupled to one another throughout the array. Inner gates 32e may likewise be so-coupled, and gates 33e and 32e may be electrically coupled to one another throughout the array. Dielectric material 64e isolates various components. Other or additional attributes as described above with respect to the embodiments of FIGS. 1-10 may be used.

Figure 13:
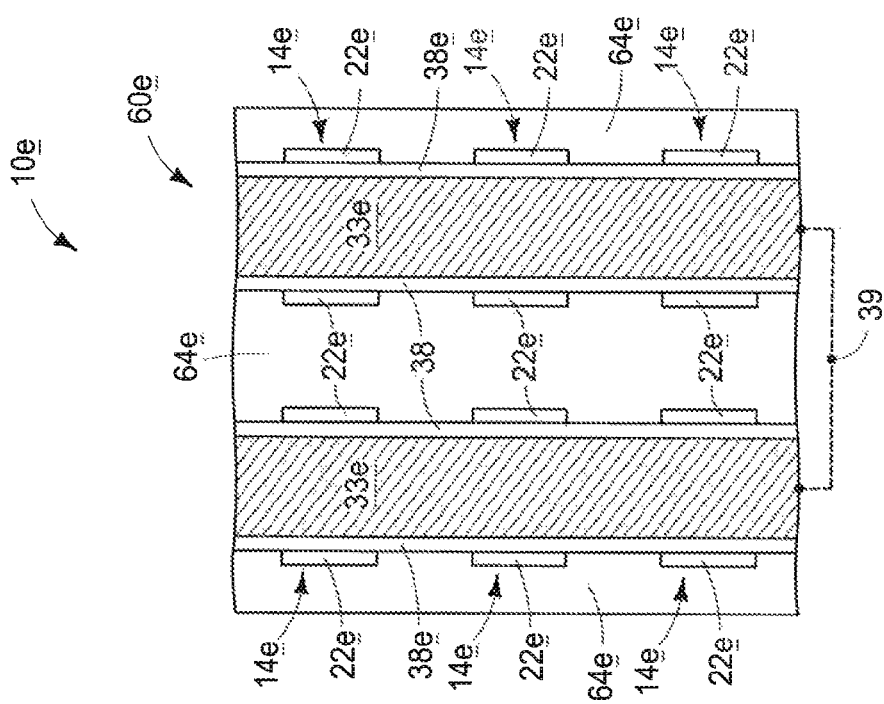
FIG. 13 is a sectional view taken through line 13-13 in FIG. 11.
Figure 15:
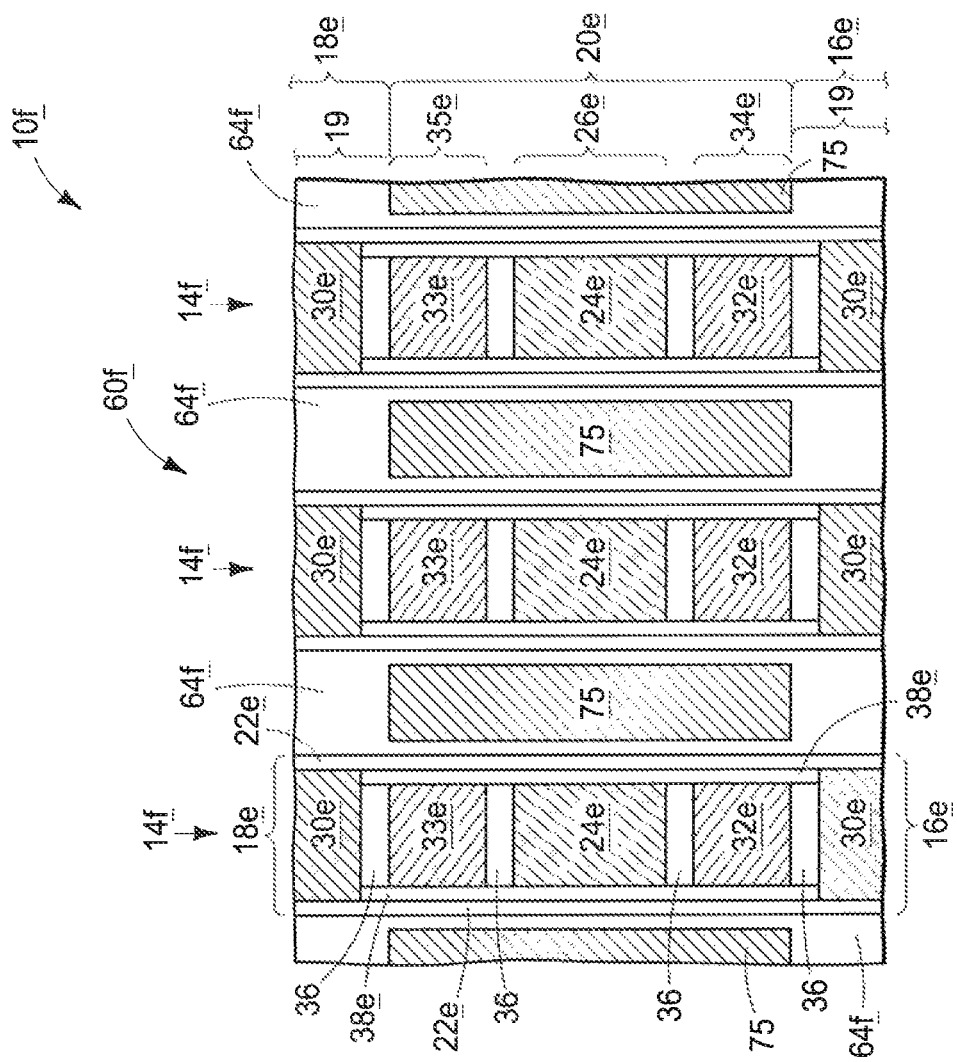
FIG. 15 is a diagrammatic sectional view of a substrate fragment comprising a portion of memory array in accordance with an embodiment of the invention.

An alternate embodiment memory array 60f is shown and described with respect to a substrate 10f in FIG. 15, and incorporates vertical field effect transistor constructions like that of FIG. 3 and is thereby similar to array 60e of FIGS. 11-14. Like numerals from the above-described embodiments have been used where appropriate, with some construction differences being indicated with the suffix "f" or with different numerals. Transistor constructions 14f are horizontally spaced from one another, with array 60f comprising back bias gates 75 within dielectric material 64f between immediately horizontally adjacent transistor constructions 14f. Back bias gates 75 may extend elevationally along elevationally outer gates, elevationally inner gates, and mid-gate 33e, 32e, and 24e, respectively, as shown. Individual back bias gates 75 may also extend longitudinally in lines parallel and between lines of material 24e and 33e as materials 24e and 33e are shown in FIGS. 12 and 13. In one embodiment, all back bias gates 75 within the array are electrically coupled with one another. Other or additional attributes as described above with respect to the FIGS. 1-14 embodiments may be used.

Additional circuitry (not shown) can be provided by the artisan for accessing (e.g., reading from and/or writing to) the memory cells within the array. Such circuitry may include forming a larger memory array into a plurality of separate sub-arrays. A "sub-array" as used in this paragraph to the end of this document is defined as a subset of the total memory array cells that are within a continuous area and that can be activated independent of other sub-arrays having others of the total memory array cells therein. Sub-arrays might be fabricated and operated independently, in tandem, or otherwise relative one another. Regardless, a transistor and a memory array in accordance with embodiments of the invention may be operated in any manner. Ideally, the effective channel length of a transistor in accordance with the invention may be electrostatically defined and dynamically varied. As one example with respect to a transistor and/or memory array, gates 33d/33e/33f may be electrically coupled relative to one another as well as to gates 32d/32e/32f in arrays 60, 60e, and 60f, respectively, throughout all of a given sub-array. In an "inactive", "standby", or "off" state for a sub-array, such gates may be biased so that semiconductive transition metal dichalcogenide material 22 immediately there-adjacent is depleted of carriers, thereby making the effective channel length of individual transistors longer (e.g., less leakage current). In the context of this disclosure, "depleted of carriers" means less than or equal to $1 \times 10^{15}$ carriers/cm$^3$ (e.g., either electrons or holes). Mid-gates 24d/24e/24f may be provided at 0 volts or slightly negative in the inactive, standby, or off state. All "inactive" sub-arrays may have their gates so-biased, for example. Such structure and operation might reduce power consumption in the inactive, standby, or off state.

For an "active" sub-array where reading and/or writing will occur relative to memory cells in that sub-array for some period of time, gates 32, 33 may be biased to induce high carrier density in the transition metal dichalcogenide material immediately there-adjacent, thereby making the effective channel length of individual transistors shorter. In the context of this document, "high carrier density" means at least $1 \times 10^{18}$ carriers/cm$^3$. The mid-gates 24d/24e/24f in the active sub-array may be operated normally in an "on" state (e.g., voltage value other than zero) to cause current flow through the effectively shorter transistor channel or in an "off" state (e.g., voltage at zero) to preclude such current flow (but for leakage). Alternate manners of operation may of course be used.

CONCLUSION

In some embodiments, a field effect transistor construction comprises two source/drain regions and a channel region there-between. The channel region comprises a transition metal dichalcogenide material having a thickness of 1 monolayer to 7 monolayers and having a physical length between the source/drain regions. A mid-gate is operatively proximate a mid-portion of the channel region relative to the physical length. A pair of gates is operatively proximate different respective portions of the channel region from the portion of the channel region that the mid-gate is proximate. The pair of gates are spaced and electrically isolated from the mid-gate on opposite sides of the mid-gate. Gate dielectric is between a) the channel region, and b) the mid-gate and the pair of gates.

In some embodiments, a vertical field effect transistor construction comprises an isolating core. A transition metal dichalcogenide material encircles the isolating core and has a lateral wall thickness of 1 monolayer to 7 monolayers. A gate dielectric encircles the transition metal dichalcogenide material. Conductive mid-gate material encircles the gate dielectric at an elevational mid-portion of the transition metal dichalcogenide material. Conductive outer gate material encircles the gate dielectric at an elevational outer portion of the transition metal dichalcogenide material. The outer gate material is elevationally spaced and electrically isolated from the mid-gate material. Conductive inner gate material encircles the gate dielectric at an elevational inner portion of the transition metal dichalcogenide material. The inner gate material is elevationally spaced and electrically isolated from the mid-gate material. An elevationally outer source/drain region encircles the isolating core and is spaced elevationally outward of and electrically isolated from the outer gate material. An elevationally inner source/drain region encircles the isolating core and is spaced elevationally inward of and electrically isolated from the inner gate material.

In some embodiments, a vertical field effect transistor construction comprises conductive mid-gate material. Conductive outer gate material is spaced above and is electrically isolated from the mid-gate material. Conductive inner gate material is spaced below and electrically isolated from the mid-gate material. Gate dielectric is over laterally opposing outer sides of the mid-gate material, the outer gate material, and the inner gate material. A pair of laterally opposing channels is over laterally opposing outer sides of the gate dielectric and is over the laterally opposing outer sides of the mid-gate material, the outer gate material, and the inner gate material. The channels of the pair respectively comprise transition metal dichalcogenide material having a lateral thickness of 1 monolayer to 7 monolayers. An elevationally inner source/drain region is electrically coupled with and is elevationally inward of those portions of the channels that are laterally over the opposing outer sides of the inner gate material. An elevationally outer source/drain region is electrically coupled with and is elevationally outward of those portions of the channels that are laterally over the opposing outer sides of the outer gate material.

In some embodiments, a memory array comprises a plurality memory cells that individually comprise a vertical field effect transistor. The transistor comprises an elevationally outer source/drain region, an elevationally inner source/drain region, and a channel region elevationally between the outer and inner source/drain regions. The channel region comprises a transition metal dichalcogenide material having a lateral thickness of 1 monolayer to 7 monolayers and having a physical length elevationally between the source/drain regions. A mid-gate is laterally proximate an elevational mid-portion of the channel region. An outer gate is above the mid-gate laterally proximate an elevational outer portion of the channel region. The outer gate is elevationally spaced and electrically isolated from the mid-gate. An inner gate is below the mid-gate laterally proximate an elevational inner portion of the channel region. The inner gate is elevationally spaced and electrically isolated from the mid-gate. Gate dielectric is laterally between a) the channel region, and b) the mid-gate, the outer gate, and the inner gate. At least one of a) the outer gates are electrically coupled to one another within the array, and b) the inner gates are electrically coupled to one another within the array.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A field effect transistor construction comprising:
   two source/drain regions and a channel region there-between, the channel region comprising a transition metal dichalcogenide material having a thickness of 1 monolayer to 7 monolayers and having a physical length between the source/drain regions;
   a mid-gate operatively proximate a mid-portion of the channel region relative to the physical length;
   a pair of gates operatively proximate different respective portions of the channel region from the portion of the channel region that the mid-gate is proximate, the pair of gates being spaced and electrically isolated from the mid-gate on opposite sides of the mid-gate; and
   gate dielectric between a) the channel region, and b) the mid-gate and the pair of gates.

2. The construction of claim 1 wherein the field effect transistor is vertically oriented.

3. The construction of claim 1 wherein the field effect transistor is horizontally oriented.

4. The construction of claim 1 wherein the gates of the pair are electrically coupled together.

5. The construction of claim 1 wherein the mid-gate has a work function which is different from that of at least one of the gates of the pair.

6. The construction of claim 1 wherein the gates of the pair have the same work function relative one another.

7. The construction of claim 6 wherein the mid-gate has the same work function as that of the gates of the pair.

8. The construction of claim 7 wherein the gates of the pair are of the same composition.

9. The construction of claim 8 wherein the mid-gate is of the same composition as that of the gates of the pair.

10. The construction of claim 6 wherein the mid-gate and the gates of the pair comprise conductively doped semiconductive material that is n-type, the work function of the mid-gate being greater than that of the gates of the pair.

11. The construction of claim 6 wherein the mid-gate and the gates of the pair comprise conductively doped semiconductive material that is p-type, the work function of the mid-gate being less than that of the gates of the pair.

12. The construction of claim 1 wherein the gates of the pair have different work functions relative one another.

13. The construction of claim 1 wherein the channel region is devoid of conductivity enhancing impurity.

14. The construction of claim 13 wherein the source/drain regions are devoid of conductivity enhancing impurity.

15. The construction of claim 1 wherein the transition metal dichalcogenide material is no greater than 4 monolayers in thickness.

16. The construction of claim 15 wherein the transition metal dichalcogenide material is no greater than 2 monolayers in thickness.

17. The construction of claim 1 wherein the transition metal dichalcogenide material comprises at least one of $MoS_2$, $WS_2$, $InS_2$, $MoSe_2$, $WSe_2$, and $InSe_2$.

18. The construction of claim 1 wherein the source/drain regions comprise the transition metal dichalcogenide material having a thickness of 1 monolayer to 7 monolayers.

19. The construction of claim 18 wherein the transition metal dichalcogenide material of the source/drain regions is devoid of conductivity enhancing impurity.

20. The construction of claim 18 wherein the field effect transistor is vertically oriented, one of the two source/drain regions being an elevationally outer source/drain region, and comprising a conductive contact directly against a lateral outer sidewall of the transition metal dichalcogenide material of the outer source/drain region.

21. The construction of claim 18 wherein the field effect transistor is vertically oriented, one of the two source/drain regions is an elevationally inner source/drain region, and comprising a conductive contact directly against a lateral outer sidewall of the transition metal dichalcogenide material of the inner source/drain region.

22. The construction of claim 1 wherein,
the channel region comprises transition metal dichalcogenide material having a thickness of 1 monolayer to 7 monolayers on each of opposing sides of the mid-gate and the pair of gates, the opposing sides of the mid-gate being different from the opposite sides of the mid-gate from which the pair of gates are spaced from; and
the gate dielectric being between a) the transition metal dichalcogenide material, and b) each of the opposing sides of the mid-gate and the pair of gates.

23. The construction of claim 22 wherein the source/drain regions individually comprise two spaced layers of the transition metal dichalcogenide material having a thickness of 1 monolayer to 7 monolayers;
conductive material between and electrically coupling the two layers.

24. A vertical field effect transistor construction comprising:
an isolating core;
a transition metal dichalcogenide material encircling the isolating core and having a lateral wall thickness of 1 monolayer to 7 monolayers;
a gate dielectric encircling the transition metal dichalcogenide material;
conductive mid-gate material encircling the gate dielectric at an elevational mid-portion of the transition metal dichalcogenide material;
conductive outer gate material encircling the gate dielectric at an elevational outer portion of the transition metal dichalcogenide material, the outer gate material being elevationally spaced and electrically isolated from the mid-gate material;
conductive inner gate material encircling the gate dielectric at an elevational inner portion of the transition metal dichalcogenide material, the inner gate material being elevationally spaced and electrically isolated from the mid-gate material;
an elevationally outer source/drain region encircling the isolating core and spaced elevationally outward of and electrically isolated from the outer gate material; and
an elevationally inner source/drain region encircling the isolating core and spaced elevationally inward of and electrically isolated from the inner gate material.

25. The construction of claim 24 wherein the isolating core, the transition metal dichalcogenide material, and the gate dielectric each have a respective perimeter that is circular in horizontal cross-section.

26. The construction of claim 24 wherein the outer and inner source/drain regions comprise the transition metal dichalcogenide material having a lateral wall thickness of 1 monolayer to 7 monolayers.

27. The construction of claim 24 comprising a conductive contact directly against a lateral outer sidewall of at least one of the outer source/drain region and the inner source/drain region.

28. The construction of claim 27 wherein the outer and inner source/drain regions comprise the transition metal dichalcogenide material having a lateral wall thickness of 1 monolayer to 7 monolayers, said conducive contact being directly against a lateral outer sidewall of the transition metal dichalcogenide material of the at least one of the outer source/drain region and the inner source/drain region.

29. A vertical field effect transistor construction comprising:
conductive mid-gate material;
conductive outer gate material spaced above and electrically isolated from the mid-gate material;
conductive inner gate material spaced below and electrically isolated from the mid-gate material;
gate dielectric over laterally opposing outer sides of the mid-gate material, the outer gate material, and the inner gate material;
a pair of laterally opposing channels over laterally opposing outer sides of the gate dielectric and over the laterally opposing outer sides of the mid-gate material, the outer gate material, and the inner gate material; the channels of the pair respectively comprising transition metal dichalcogenide material having a lateral thickness of 1 monolayer to 7 monolayers;
an elevationally inner source/drain region electrically coupled with and elevationally inward of those portions of the channels that are laterally over the opposing outer sides of the inner gate material; and
an elevationally outer source/drain region electrically coupled with and elevationally outward of those portions of the channels that are laterally over the opposing outer sides of the outer gate material.

30. The construction of claim 29 wherein the elevationally outer and inner source/drain regions comprise the transition metal dichalcogenide material having a lateral wall thickness of 1 monolayer to 7 monolayers.

31. The construction of claim 30 comprising a conductive contact directly against a lateral outer sidewall of the transition metal dichalcogenide material of at least one of the elevationally outer source/drain region and the elevationally inner source/drain region.

32. A memory array, comprising:
a plurality memory cells individually comprising a vertical field effect transistor, the transistor comprising:
an elevationally outer source/drain region, an elevationally inner source/drain region, and a channel region elevationally between the outer and inner source/drain regions, the channel region comprising a transition metal dichalcogenide material having a lateral thickness of 1 monolayer to 7 monolayers and having a physical length elevationally between the source/drain regions;

a mid-gate laterally proximate an elevational mid-portion of the channel region;

an outer gate above the mid-gate laterally proximate an elevational outer portion of the channel region, the outer gate being elevationally spaced and electrically isolated from the mid-gate;

an inner gate below the mid-gate laterally proximate an elevational inner portion of the channel region, the inner gate being elevationally spaced and electrically isolated from the mid-gate; and gate dielectric laterally between a) the channel region, and b) the mid-gate, the outer gate, and the inner gate;

at least one of a) the outer gates being electrically coupled to one another within the array, and b) the inner gates being electrically coupled to one another within the array.

33. The memory array of claim 32 wherein the outer gates are electrically coupled to one another within the array.

34. The memory array of array of claim 32 wherein the inner gates are electrically coupled to one another within the array.

35. The memory array of claim 32 wherein the outer gates are electrically coupled to one another within the array, and the inner gates are electrically coupled to one another and to the outer gates within the array.

36. The memory array of claim 32 wherein the elevationally outer and inner source/drain regions comprise the transition metal dichalcogenide material having a lateral wall thickness of 1 monolayer to 7 monolayers.

37. The memory array of claim 32 wherein a plurality of the vertical transistors are horizontally spaced from one another, and further comprising a back bias gate within dielectric material between immediately horizontally adjacent of the transistors; the back bias gate extending elevationally along the elevationally outer, elevationally inner, and mid-gates.

38. The memory array of claim 37 wherein all back bias gates within the array are electrically coupled with one another.

* * * * *